(12) United States Patent
Shimizu et al.

(10) Patent No.: US 11,228,122 B2
(45) Date of Patent: Jan. 18, 2022

(54) ELECTRICAL CONDUCTION STRUCTURE FOR SHIELDING AND AN ELECTRONIC DEVICE USING THE SAME

(71) Applicant: MITSUBISHI ELECTRIC CORPORATION, Tokyo (JP)

(72) Inventors: Ryotaro Shimizu, Tokyo (JP); Akira Kobayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/961,849

(22) PCT Filed: Feb. 19, 2018

(86) PCT No.: PCT/JP2018/005767
§ 371 (c)(1),
(2) Date: Jul. 13, 2020

(87) PCT Pub. No.: WO2019/159365
PCT Pub. Date: Aug. 22, 2019

(65) Prior Publication Data
US 2020/0350705 A1    Nov. 5, 2020

(51) Int. Cl.
*H01R 4/48* (2006.01)
*H01R 4/30* (2006.01)
(Continued)

(52) U.S. Cl.
CPC .............. *H01R 4/48* (2013.01); *H01R 4/304* (2013.01); *H01R 4/4809* (2013.01); *H01R 12/61* (2013.01);
(Continued)

(58) Field of Classification Search
CPC ........ H01R 4/48; H01R 4/304; H01R 4/4809; H01R 13/6581; H01R 13/6582; H01R 13/6593; H01R 13/648; H01R 13/6583; H01R 13/658; H01R 2201/26; H01R 13/6591; H01R 13/6595; H01R 13/6485; H01R 13/2407; H01R 13/2492;
(Continued)

(56) References Cited

U.S. PATENT DOCUMENTS 5,433,630 A * 7/1995 Inaba .................. H01R 13/187
439/287
2011/0163569 A1  7/2011 Yoneyama

FOREIGN PATENT DOCUMENTS

JP      55-99191 U    7/1980
JP      1-146595 U    10/1989
(Continued)

OTHER PUBLICATIONS

International Search Report (PCT/ISA/210) issued in PCT/JP2018/005767 dated Apr. 10, 2018.

*Primary Examiner* — Abdullah A Riyami
*Assistant Examiner* — Justin M Kratt
(74) *Attorney, Agent, or Firm* — Birch, Stewart, Kolasch & Birch, LLP

(57) ABSTRACT

A first sheet metal is provided with slits. Elastic pieces having flat shapes are each formed between the slits adjacent to each other, and both ends of each of the elastic pieces are connected with both ends of an adjacent one of the elastic pieces. A second sheet metal is provided with protrusions each of which is protruded toward a corresponding one of the elastic pieces.

14 Claims, 6 Drawing Sheets

(51) Int. Cl.
  *H05K 7/14* (2006.01)
  *H01R 12/61* (2011.01)
  *H01R 13/658* (2011.01)
  *H01R 13/24* (2006.01)
  *H05K 9/00* (2006.01)
  *H01R 13/6581* (2011.01)
  *H01R 13/648* (2006.01)
  *H01R 13/6583* (2011.01)
  *H01R 13/6582* (2011.01)
  *H01R 12/77* (2011.01)
  *H01R 13/6595* (2011.01)
  *H05K 5/02* (2006.01)
  *H01R 13/6591* (2011.01)
  *H01R 13/6593* (2011.01)

(52) U.S. Cl.
  CPC .......... *H01R 12/613* (2013.01); *H01R 12/775* (2013.01); *H01R 13/24* (2013.01); *H01R 13/2407* (2013.01); *H01R 13/2492* (2013.01); *H01R 13/648* (2013.01); *H01R 13/6485* (2013.01); *H01R 13/658* (2013.01); *H01R 13/6581* (2013.01); *H01R 13/6582* (2013.01); *H01R 13/6583* (2013.01); *H01R 13/6591* (2013.01); *H01R 13/6593* (2013.01); *H01R 13/6595* (2013.01); *H01R 2201/26* (2013.01); *H05K 5/0217* (2013.01); *H05K 7/1432* (2013.01); *H05K 9/0024* (2013.01); *Y10S 439/904* (2013.01); *Y10S 439/939* (2013.01)

(58) Field of Classification Search
  CPC ...... H01R 12/775; H01R 13/24; H01R 12/61; H01R 12/613; H05K 7/1432; H05K 5/0217; H05K 9/0024; H05K 9/0026; Y10S 439/904; Y10S 439/939
  USPC .............. 439/607.49, 607.55, 607.56, 67, 77
  See application file for complete search history.

(56) References Cited

FOREIGN PATENT DOCUMENTS

| | | | |
|---|---|---|---|
| JP | 01146595 U | * | 10/1989 |
| JP | 2-79096 U | | 6/1990 |
| JP | 02079096 U | * | 6/1990 |
| JP | 2-91397 U | | 7/1990 |
| JP | 8-222879 A | | 8/1996 |
| JP | 2009-105036 A | | 5/2009 |
| JP | 2016-15272 A | | 1/2016 |

* cited by examiner

ELECTRICAL CONDUCTION STRUCTURE FOR SHIELDING AND AN ELECTRONIC DEVICE USING THE SAME

TECHNICAL FIELD

The present invention relates to a conduction structure for causing sheet metals to have conduction to each other.

BACKGROUND ART

In electronic devices, there is a case where it is necessary to ensure conduction between sheet metals. For example, it is a case where conduction between sheet metals is ensured for electromagnetic compatibility (EMC) measures. More specifically, a large electronic device requires a sheet metal having a large area. However, when a large sheet metal is used, the production cost is increased, and the productivity is reduced. Thus, there is a case where a plurality of small sheet metals is arranged to partially overlap each other to ensure conduction between the small sheet metals and used instead of the large sheet metal. To ensure conduction between the sheet metals, it is important to cause the sheet metals to be stably in contact with each other.

For example, in a terminal mounting structure of Patent Literature 1, a terminal is conductively connected to a conductor formed on a substrate. The terminal includes a fixing portion, an elastic portion extending from the fixing portion, and a substrate contact portion provided on the elastic portion. The substrate contact portion is provided on the elastic portion to be protruded toward the substrate, and is electrically connected to the conductor. Furthermore, the substrate contact portion is bonded to the substrate with an adhesive while being in contact with the conductor.

CITATION LIST

Patent Literatures

Patent Literature 1: JP 2009-105036 A

SUMMARY OF INVENTION

Technical Problem

In the structure described in Patent Literature 1, the elastic portion and the substrate contact portion are formed by a member curved in a wave shape. When the member is curved in a wave shape, the shape tends to vary at the time of manufacturing, and the shape tends to deform after manufacturing. For this reason, in the structure described in Patent Literature 1 there is a case in which the substrate contact portion cannot be in contact with the substrate, and thus the contact is unstable between the substrate contact portion and the conductor. Thus, for example, even if such a structure described in Patent Literature 1 is applied to a conduction structure between sheet metals, the sheet metals cannot be caused to be stably in contact with each other.

The present invention has been made to solve the above-described problem, and aims to obtain a conduction structure capable of causing sheet metals to be stably in contact with each other.

Solution to Problem

A conduction structure according to the present invention includes: a plurality of elastic pieces having flat shapes provided for a first sheet metal, adjacent two of the elastic pieces being aligned, a slit formed in the first sheet metal being interposed between the adjacent two of the elastic pieces, both, ends of each of the elastic pieces being connected with respective both ends of an adjacent one of the elastic pieces and protrusions that are provided for a second sheet metal overlapped with the first sheet metal, and each of which is protruded toward a corresponding one of the elastic pieces provided for the first sheet metal.

Advantageous Effects of Invention

According to the present invention, the elastic pieces having flat shapes provided for the first sheet metal and the protrusions provided for the second sheet metal cause the sheet metals to be stably in contact with each other.

DESCRIPTION OF EMBODIMENTS

Hereinafter, to explain the present invention in more detail, embodiments for carrying out the present invention will be described with reference to the accompanying drawings.

First Embodiment

Figure 1:
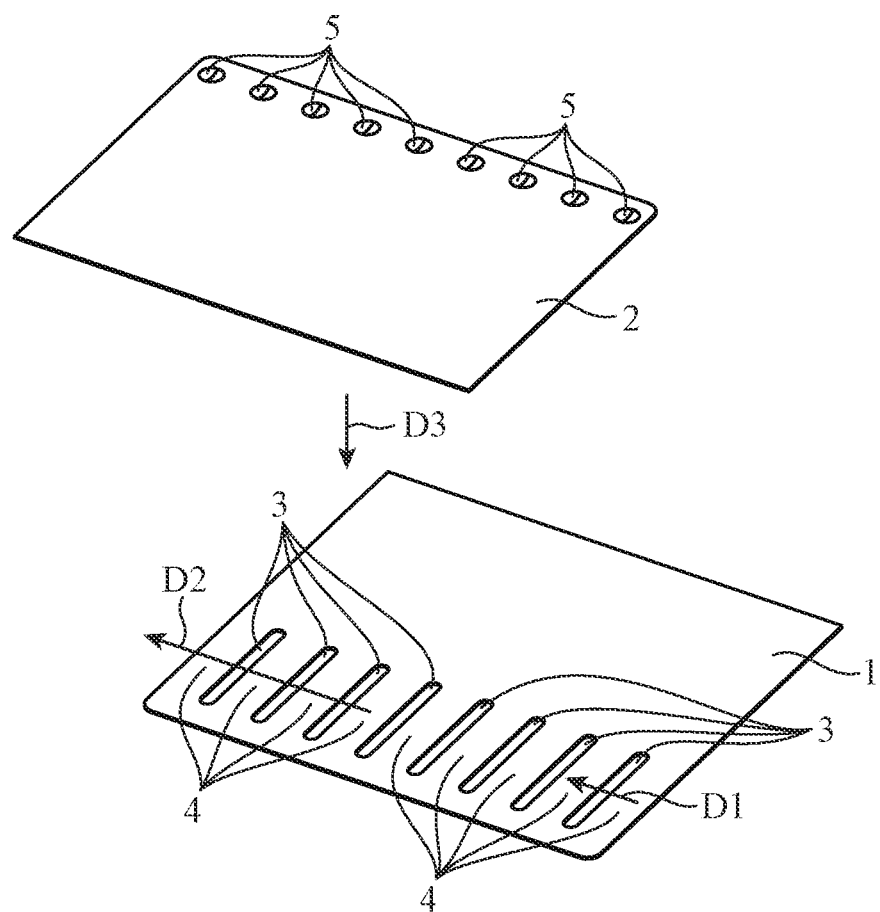
FIG. 1 is a perspective view illustrating a conduction structure according to a first embodiment before a first sheet metal and a second sheet metal overlap each other.

FIG. 1 is a perspective view illustrating a conduction structure according to a first embodiment. FIG. 1 illustrates a state before a first sheet metal 1 and a second sheet metal 2 overlap each other.

The first sheet metal 1 is provided with slits 3 each having a substantially rectangular shape. A plurality of the slits 3 is aligned in a short direction D1 of the slit 3 itself.

Elastic pieces 4 having substantially rectangular flat Shapes are each provided between the slits 3 adjacent to each other. Each of the elastic pieces 4 is aligned with an adjacent one of the elastic pieces 4 with the slit 3 interposed therebetween. A direction D2 in which the elastic pieces 4 are aligned almost coincides with the short direction D1 of the slit 3.

The periphery of the slit 3 is a closed curve, and the both ends of each of the elastic pieces 4 are connected with the both ends of the adjacent one of the elastic pieces 4. The both ends are two ends aligned in the longitudinal direction of the slit 3.

The second sheet metal 2 is provided with protrusions 5. The protrusion 5 protrudes from the second sheet metal 2 in a substantially hemispherical shape. The protrusion 5 is provided, for example, by dowel processing to the second sheet metal 2. Alternatively, the protrusion 5 is provided, for example, by fixing a substantially hemispherical metal member to the second sheet metal 2 in a state in which they are caused to be in contact with each other in a conductible manner. In this case, the substantially hemispherical metal member is the protrusion 5.

The number of the protrusions 5 is basically the same as the number of the elastic pieces 4. Furthermore, the interval between the adjacent protrusions 5 is substantially the same as the interval between the adjacent elastic pieces 4. Here, the interval between the adjacent protrusions 5 is, for example, the distance between the centers of the protrusions 5. The interval between the adjacent elastic pieces 4 is, for example, the distance between the centers of the elastic pieces 4 in the direction D2 in which the elastic pieces 4 are aligned.

As illustrated in FIG. 1, the second sheet metal 2 is to be overlapped with the first sheet metal 1 by moving in a direction D3 in a state in which the protrusions 5 protrude toward the elastic pieces 4 of the first sheet metal 1. The direction D3 is a direction substantially perpendicular to both surfaces of the first sheet metal 1 and the second sheet metal 2 when the sheet metals are arranged so that their surfaces are substantially parallel to each other.

Figure 2:
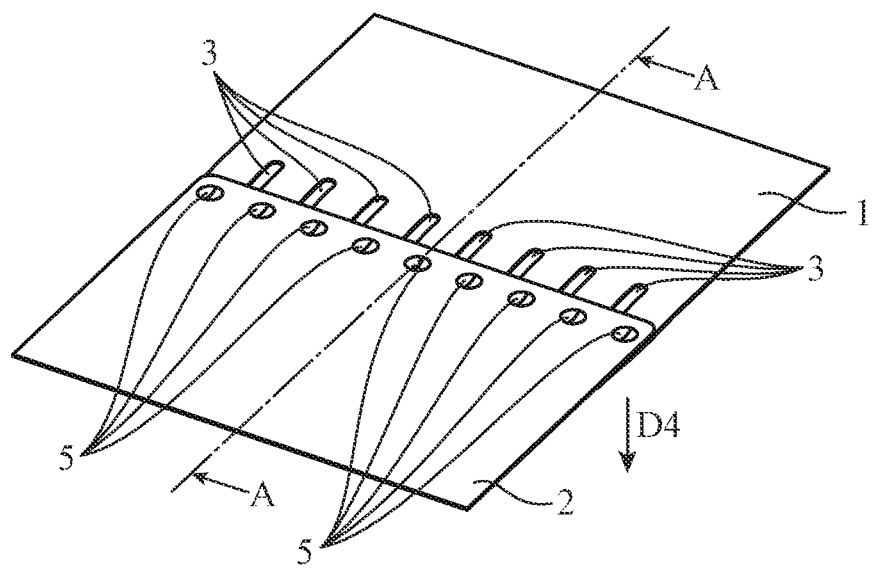
FIG. 2 is a perspective view illustrating the conduction structure according to the first embodiment when the first sheet metal 1 and the second sheet metal 2 overlap each other.

FIG. 2 is a perspective view illustrating the conduction structure according to the first embodiment, similarly to FIG. 1. FIG. 2 illustrates a state in which the first sheet metal 1 and the second sheet metal 2 overlap each other.

Although not illustrated, the second sheet metal 2 and the first sheet metal 1 are fixed to each other by using a known method such as screwing or claw mating. Alternatively, the second sheet metal 2 and the first sheet metal 1 may be fixed to each other by a member (not illustrated) clamping the second sheet metal 2 and the first sheet metal 1. At this time, the protrusion 5 provided for the second sheet metal 2 pushes the elastic piece 4 provided for the first sheet metal 1 in a direction D4 in FIG. 2, and thereby bends the elastic piece 4. The direction D4 is a direction substantially perpendicular to both surfaces of the first sheet metal 1 and the second sheet metal 2 when the sheet metals are arranged so that their surfaces are substantially parallel to each other.

Figure 3:
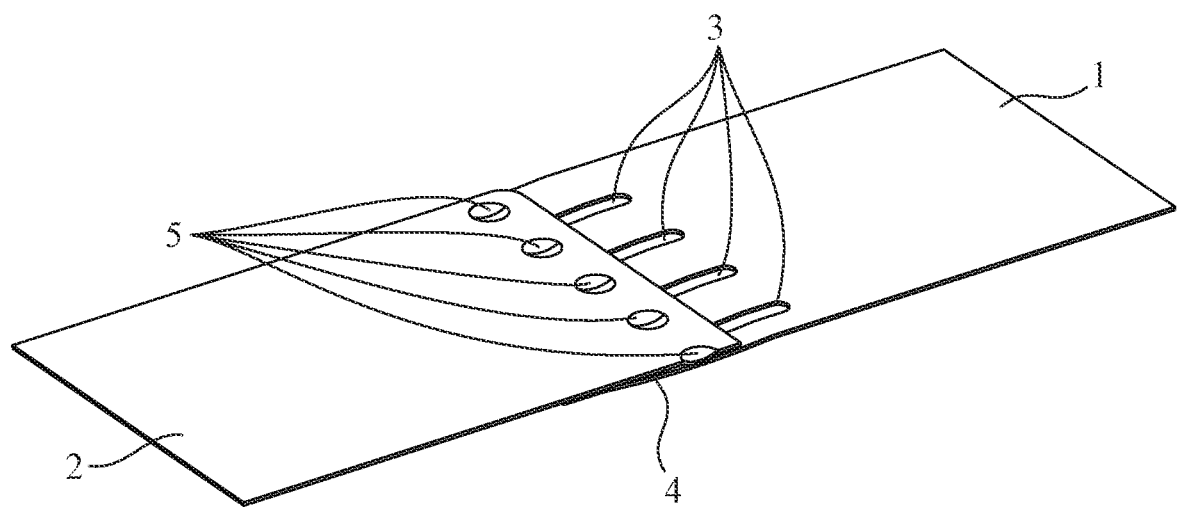
FIG. 3 is a cross-sectional perspective view of the first sheet metal and the second sheet metal cut along line A-A in FIG. 7.

FIG. 3 is a cross-sectional perspective view of the first sheet metal 1 and the second sheet metal 2 cut along line A-A in FIG. 2. The protrusion 5 is in contact with the elastic piece 4 in a state in which the elastic piece 4 is elastically deformed.

As illustrated in FIG. 1, the elastic piece 4 does not have a complicated shape such as being curved in a wave shape, but has a flat shape, and thus there is less variation in the shape from the other elastic pieces 4. Furthermore, since the protrusion 5 only needs to be provided for the flat second sheet metal 2, there is less variation in the shape, such as the amount of protrusion from the second sheet metal 2, from the other protrusions 5. Thus, the protrusion 5 can be stably in contact with the elastic piece 4. Furthermore, even if the amount of protrusion of the protrusion 5 varies within a tolerance, the elastic piece 4 individually bends, whereby the protrusion 5 can be stably in contact with the elastic piece 4. Thus, conduction is sufficiently ensured between the first sheet metal 1 and the second sheet metal 2.

Due to elasticity of the elastic piece 4, a state can be maintained in which the elastic piece 4 and the protrusion 5 are stably in contact with each other, so that reinforcement with an adhesive or the like is unnecessary for maintaining the contact state. The reinforcement with the adhesive causes a need to manage the work so that the contact state is obtained when the adhesive is fixed, which is troublesome.

Furthermore, both ends of the elastic piece 4 are connected with both ends of the adjacent elastic piece 4 and thereby are fixed ends, whereby the elastic piece 4 is less likely to be deformed during handling of the first sheet metal 1. Furthermore, also the fact that the elastic piece 4 has a flat shape and does not protrude from other portions of the first sheet metal 1 helps the elastic piece 4 to be less likely to be deformed during handling. If the elastic piece 4 is curved in a wave shape, for example, the protruding curved portion is likely to be deformed due to contact with or catching on another member during handling.

Furthermore, since the protrusion 5 has a substantially hemispherical shape, metal powder due to scraping of the elastic piece 4 or the protrusion 5 is less likely to be generated during contact between the elastic piece 4 and the protrusion 5. If the protrusion 5 has a shape with a corner, the elastic piece 4 or the protrusion 5 is scraped off during contact between the elastic piece 4 and the protrusion 5, and thus metal powder is easily generated. The metal powder reaches a substrate (not illustrated) as metal foreign matter and thereby causes a short circuit.

Figure 4:
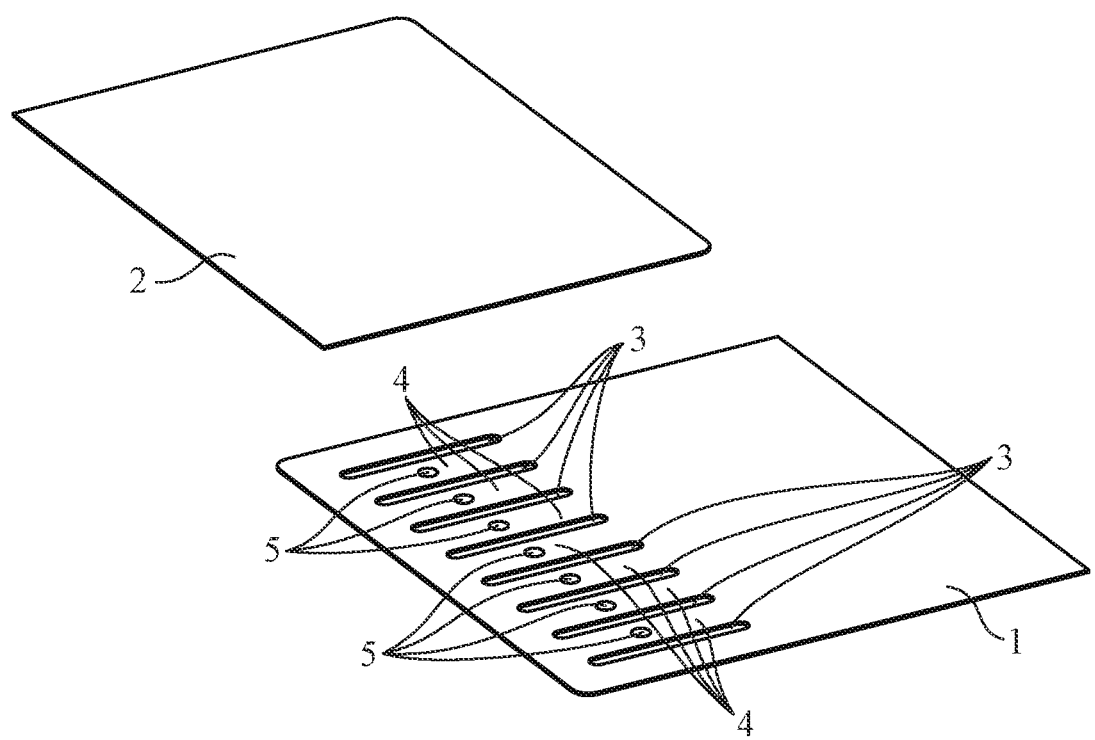
FIG. 4 is a perspective view illustrating a modification of the conduction structure according to the first embodiment.

Note that, in the above description, the case where the protrusion 5 is provided for the second sheet metal 2 has been described. However, the protrusion 5 only needs to be interposed between the second sheet metal 2 and the elastic piece 4 provided for the first sheet metal 1, and thus may be provided for the first sheet metal 1. For example, when the processing of the second sheet metal 2 is restricted due to the material of the second sheet metal 2 and thus it is difficult to provide the protrusion 5 on the second sheet metal 2, the protrusion 5 may be provided on the elastic piece 4 as illustrated in FIG. 4. The protrusion 5 illustrated in FIG. 4 is provided partially in the direction D2 in which the elastic pieces 4 are aligned, on each of the elastic pieces 4. The direction D2 is as illustrated in FIG. 1.

FIG. 4 illustrates a state before the first sheet metal 1 and the second sheet metal 2 overlap each other, and the second sheet metal 2 is to be overlapped with the first sheet metal 1 in a state in which the protrusion 5 protrudes toward the second sheet metal 2.

Even if the conduction structure is structured as illustrated in FIG. 4, conduction between the first sheet metal 1 and the second sheet metal 2 is sufficiently ensured similarly to the conduction structure described with reference to FIGS. 1-2, and 3. More specifically, the protrusion 5 is provided not entirely but partially in the direction D2 in which the elastic pieces 4 are aligned, Whereby the elastic piece 4 does not have a complicated shape such as being curved in a wave shape while being provided with the protrusion 5, and thus there is less variation in the shape form the other elastic pieces 4. Furthermore, even if the amount of protrusion of the protrusion 5 varies within a tolerance, the elastic piece 4 individually bends, Whereby the protrusion 5 can be stably in contact with the second sheet metal 2. Thus, conduction is sufficiently ensured between the first sheet metal 1 and the second sheet metal 2.

Furthermore, in the above description, the case where the protrusion 5 has a substantially hemispherical shape has been described. However, from a viewpoint of ensuring conduction between the first sheet metal 1 and the second sheet metal 2, the shape of the protrusion 5 may be another shape, such as a substantially columnar shape. In short, the protrusion 5 may have any shape as long as it protrudes.

However, as described above, it is preferable that the protrusion 5 has a substantially hemispherical shape since metal powder is less likely to be generated. Note that, an example of a preferable shape of the protrusion 5 in which metal powder is less likely to be generated is a shape of a part of a sphere including the illustrated substantially hemispherical shape. Moreover, if a shape has a smooth curved surface even if it is not a part of a complete sphere, it can be said that the shape is the preferable shape of the protrusion 5 in which metal powder is less likely to be generated. Here, each of these preferable shapes is referred to as a shape having a spherical surface.

Furthermore, in the above description, the case where the slit 3 has a substantially rectangular shape has been described. However, the slit 3 may have another shape, such as a substantially half-moon shape. In short, it is sufficient that the slit 3 can form the elastic piece 4. Furthermore, the number of slits 3 is not limited to the number illustrated above.

Figure 5:
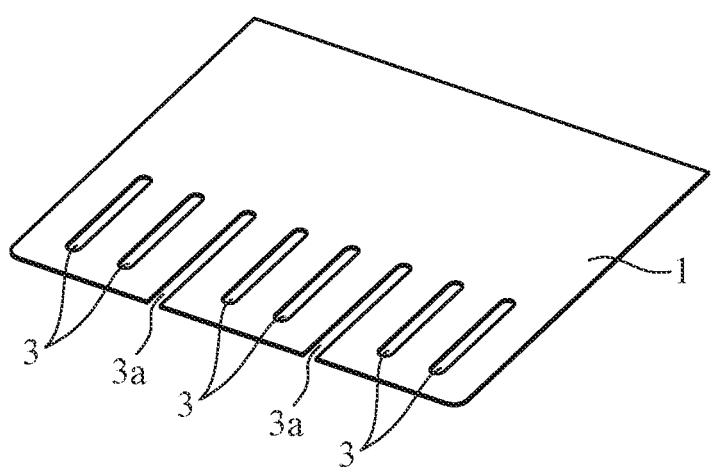
FIG. 5 is a perspective view illustrating a modification of slits.

Furthermore, in the above description, the case has been described in which each of the peripheries of all the slits 3 is a closed curve, and the elastic pieces 4 are formed by such slits 3. However, as illustrated in FIG. 5, for example, among the slits 3 forming the elastic pieces 4, each of the peripheries of some slits 3a may be an open curve.

Figure 6:
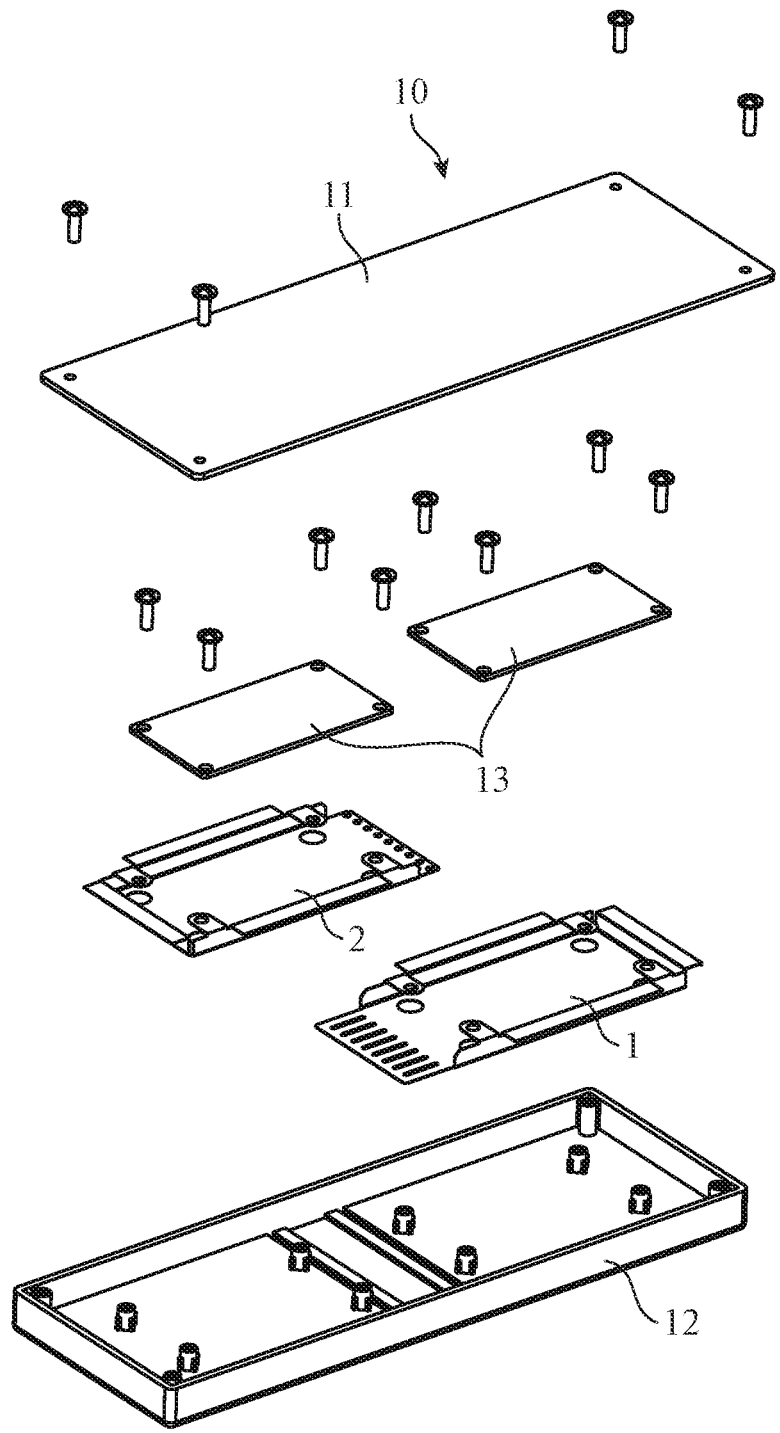
FIG. 6 is an exploded perspective view illustrating an electronic device including the conduction structure according to the first embodiment.
Figure 7:
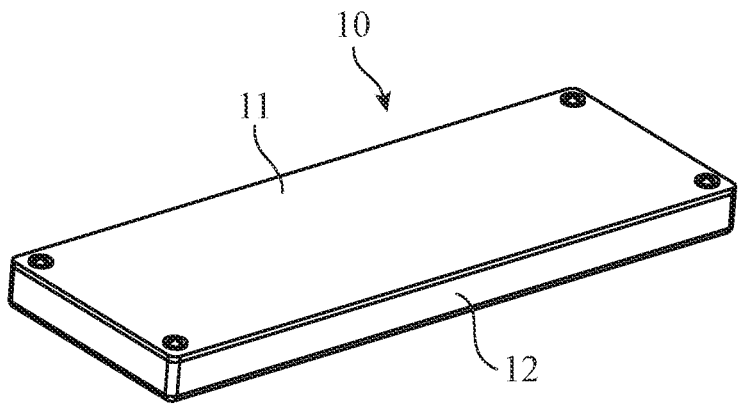
FIG. 7 is an external perspective view of the electronic device in FIG. 6.

FIG. 6 is an exploded perspective view illustrating an electronic device 10 including the conduction structure according to the first embodiment. Furthermore, FIG. 7 is an external perspective view of the electronic device 10.

In the electronic device 10, substrates 13 are fixed in an internal space formed by screwing an upper housing 11 and a kw housing 12 together. The first sheet metal 1 and the second sheet metal 2 are electrically connected with each other through the above-described conduction structure, and thereby function as a shield sheet metal of the electronic device 10.

Note that, when the electronic device 10 is mounted on a vehicle, vibration, impact, or the like is applied during driving. Since the elastic piece 4 is not easily deformed as described above, it is particularly suitable for use in an environment where vibration, impact, or the like is applied. Furthermore, if the protrusion 5 has a spherical surface, metal powder dire to scraping is unlikely to be generated as described above even if vibration, impact, or the like is applied. Also in this regard, the conduction structure according to the first embodiment is suitable for use in an environment where vibration, impact, or the like is applied.

As described above, with the conduction structure according to the first embodiment, there is less variation in the shape of the elastic pieces 4 and the protrusions 5 used for causing the first sheet metal 1 and the second sheet metal 2 to be in contact with each other, and thus the first sheet metal 1 and the second sheet metal 2 can be caused to be stably in contact with each other.

Furthermore, the protrusion 5 has a spherical surface. Thus, generation of metal foreign matter can be suppressed.

Furthermore, the electronic device 10 includes the above-described conduction structure. The first sheet metal 1 and the second sheet metal 2 function as, for example, a shield sheet metal of the electronic device 10.

Furthermore, the electronic device 10 including the conduction structure is to be mounted on a vehicle. The first sheet metal 1 and the second sheet metal 2 can be caused to be stably in contact with each other even in an environment where vibration impact, or the like is applied.

Second Embodiment

Figure 8:
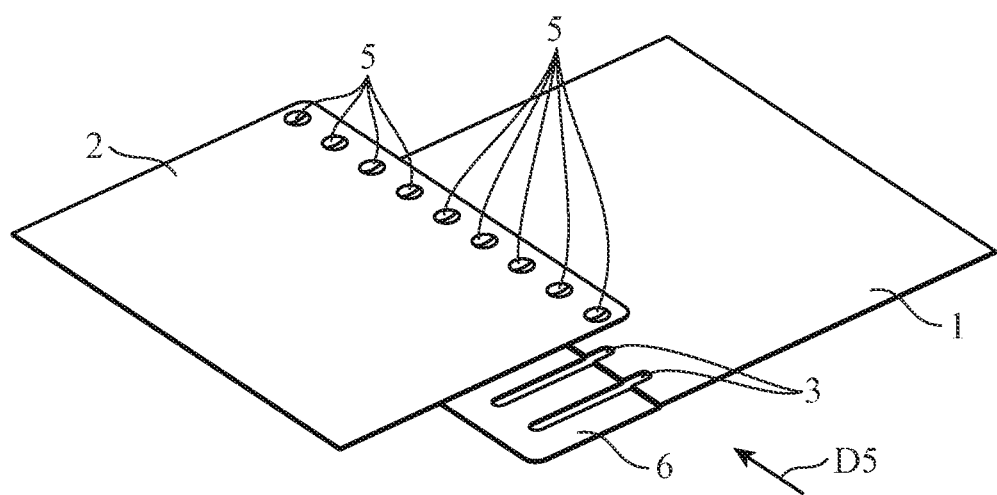
FIG. 8 is a perspective view illustrating a conduction structure according to a second embodiment before the first sheet metal and the second sheet metal overlap each other.

FIG. 8 is a perspective view illustrating a conduction structure according to a second embodiment. FIG. 8 illustrates a state before the first sheet metal 1 and the second sheet metal 2 overlap each other.

The first sheet metal 1 of the second embodiment includes a depression 6 unlike the first sheet metal 1 of the first embodiment. The depression 6 is provided, for example, by subjecting the first sheet metal 1 to Z-bending processing.

Figure 9:
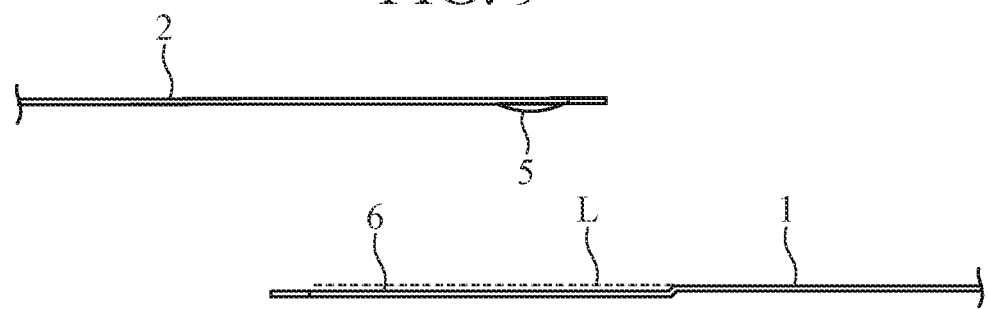
FIG. 9 is a side view of the conduction structure according to the second embodiment as viewed from a direction D5 in FIG. 8.

FIG. 9 is a side view of the conduction structure according to the second embodiment. FIG. 9 is a side view as viewed from a direction D5 in FIG. 8. The second sheet metal 2 is to be overlapped with the depression 6. Thus, when the first sheet metal 1 and the second sheet metal 2 are overlapped, a surface on the opposite side of the second sheet metal 2 from a surface facing the first sheet metal 1 is positioned at a line L in FIG. 9. More specifically, it is possible to prevent the second sheet metal 2 from protruding to an upper level in FIG. 9 than a portion of the first sheet metal 1 other than the depression 6. Note that, the amount of protrusion of the second sheet metal 2 when the second sheet metal 2 is overlapped with the depression 6 can be appropriately adjusted by adjusting the depth of the depression 6. The conduction structure illustrated in FIGS. 8 and 9 is useful when a space on the opposite side from the first sheet metal 1 as viewed from the second sheet metal 2 has no margin.

As described above, with the conduction structure according to the second embodiment, in addition to the effects of the first embodiment, the position of the second sheet metal 2 in the thickness direction of the first sheet metal 1 can be adjusted.

Note that, in FIGS. 8 and 9, the case has been illustrated where the depression 6 is provided to the first sheet metal 1 in the conduction structure in which the protrusions 5 are provided on the second sheet metal 2. Even if the first sheet metal 1 is provided with the depression 6 in the conduction structure in which the protrusions 5 are provided on the first sheet metal 1 as illustrated in FIG. 4, a similar effect can be obtained.

Third Embodiment

Figure 10:
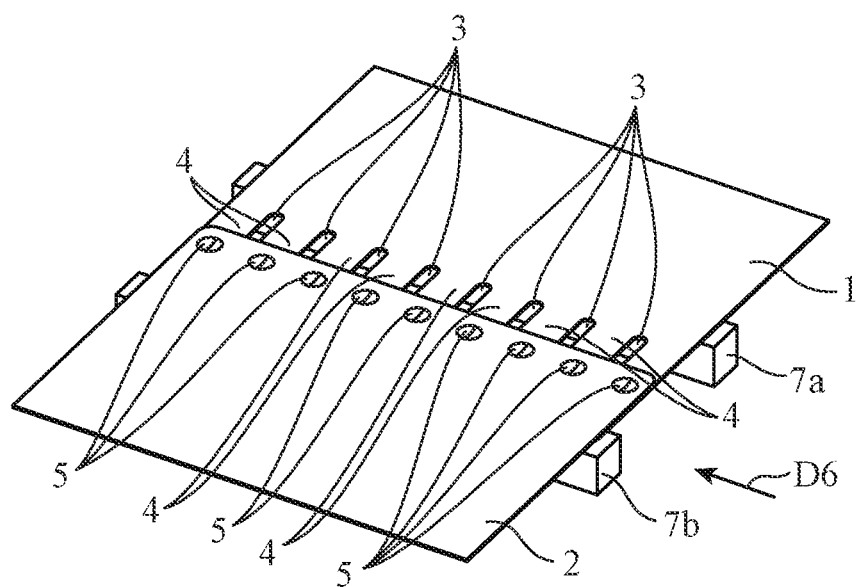
FIG. 10 is a perspective view illustrating a conduction structure according to a third embodiment when the first sheet metal 1 and the second sheet metal 2 overlap each other.

FIG. 10 is a perspective view illustrating a conduction structure according to a third embodiment. FIG. 10 illustrates a state m which the first sheet metal 1 and the second sheet metal 2 overlap each other.

At both ends of the elastic piece 4, a support member 7a and a support member 7b are provided on a surface on the opposite side from a surface with which the second sheet metal 2 is overlapped.

The support members 7a and 7b are rod-shaped members extending in the direction D2 in which the elastic pieces 4 are aligned, at both ends of the elastic piece 4. The direction D2 is as illustrated in FIG. 1.

Figure 11:
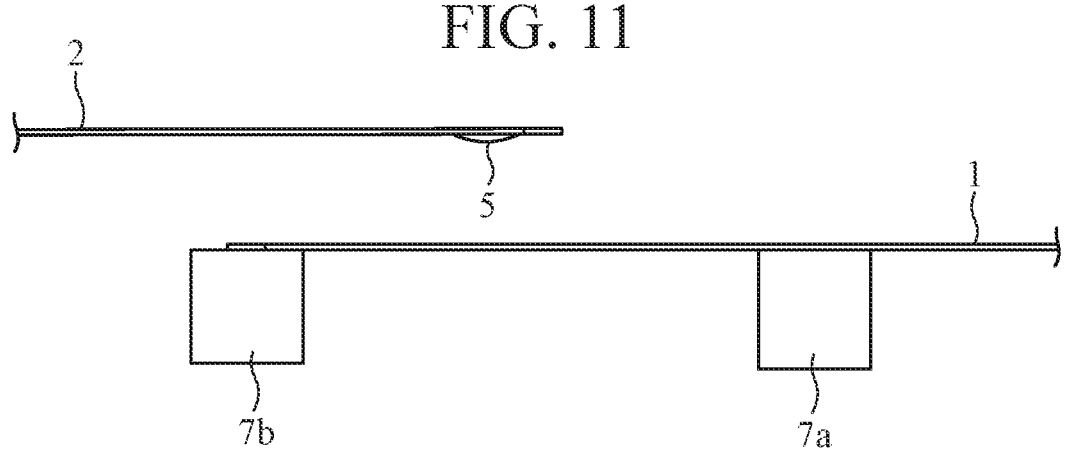
FIG. 11 is a side view illustrating the conduction structure according to the third embodiment before the first sheet metal and the second sheet metal overlap each other.
Figure 12:
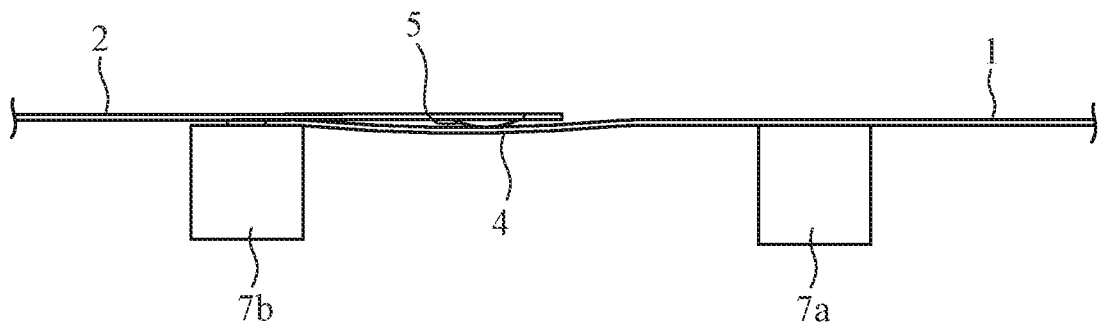
FIG. 12 is a side view of the conduction structure according to the third embodiment as viewed from a direction D6 in FIG. 10.

FIG. 11 is a side view illustrating a state before the first sheet metal 1 and the second sheet metal 2 overlap each other. FIG. 12 is a side view illustrating a state in which the first sheet metal 1 and the second sheet metal 2 overlap each other. FIG. 12 corresponds to a side view as viewed from a direction D6 in FIG. 10.

The support members 7a and 7b are provided, whereby it can be prevented that the entire first sheet metal 1 bends even if pressing force received by the first sheet metal 1 from the second sheet metal 2 is large when the second sheet metal 2 is overlapped with the first sheet metal 1. Thus, even when the pressing force received by the first sheet metal 1 from the second sheet metal 2 is large, conduction is sufficiently ensured between the first sheet metal 1 and the second sheet metal 2.

As described, above, with the conduction structure according to the third embodiment, the effect of the first embodiment can be obtained even when the pressing farce received by the first sheet metal 1 from the second sheet metal 2 is large.

Note that, in FIGS. 10, 11 and 12, the case has been illustrated where the support members 7a and 7b are provided on the first sheet metal 1 in the conduction structure in which the protrusions 5 are provided on the second sheet metal 2. Even if the first sheet metal 1 is provided with the support members 7a and 7b in the conduction structure in which the protrusions 5 are provided on the first sheet metal 1 as illustrated in FIG. 4, a similar effect can be obtained.

Furthermore, in the invention of the present application, within the scope of the invention, free combination of embodiments, a modification of any component of each embodiment, or omission of any component in each embodiment is possible.

INDUSTRIAL APPLICABILITY

As described above, the conduction structure according to the present invention can cause the sheet metals to be stably in contact with each other, and thus is suitable for use in, for example, electronic devices that require EMC measures.

REFERENCE SIGNS LIST

1: first sheet metal, 2: second sheet metal, 3, 3a: slit, 4: elastic piece, 5: protrusion, 6: depression, 7a, 7b: support member, 10: electronic device, 11: upper housing, 12: lower housing, 13: substrate.

The invention claimed is:

1. A conduction structure comprising:
a plurality of elastic pieces having flat shapes provided for a first sheet metal, adjacent two of the elastic pieces being aligned, a slit formed in the first sheet metal being interposed between the adjacent two of the elastic pieces so that the slit and the adjacent two of the elastic pieces extend within a plane of the first sheet metal, both ends of each of the elastic pieces being connected with respective both ends of an adjacent one of the elastic pieces; and
protrusions that are provided for a second sheet metal overlapped with the first sheet metal to permit the second sheet metal to electrically connect with the first sheet metal, and each of which is protruded toward a corresponding one of the elastic pieces provided for the first sheet metal.

2. The conduction structure according to claim 1, wherein the second sheet metal is overlapped with a depression provided in the first sheet metal, the depression being located in the plurality of elastic pieces and directly adjacent to the slit.

3. The conduction structure according to claim 1, wherein support members extending in a direction in which the plurality of elastic pieces is aligned are provided, on a surface on an opposite side of the first sheet metal from a surface with which the second sheet metal is overlapped, at the respective both ends of each of the plurality of elastic pieces provided for the first sheet metal.

4. The conduction structure according to claim 1, wherein each of the protrusions has a spherical surface.

5. An electronic device comprising the conduction structure according to claim 1.

6. The electronic device according to claim 5, wherein the electronic device is to be mounted on a vehicle.

7. A conduction structure comprising:
a plurality of elastic pieces having flat shapes provided for a first sheet metal, adjacent two of the elastic pieces being aligned, a slit formed in the first sheet metal being interposed between the adjacent two of the elastic pieces so that the slit and the adjacent two of the elastic pieces extend within a plane of the first sheet metal, both ends of each of the elastic pieces being connected with respective both ends of an adjacent one of the elastic pieces; and
protrusions each of which is provided partially in a direction in which the plurality of elastic pieces is aligned, on a corresponding one of the elastic pieces provided for the first sheet metal, and each of which is protruded toward a second sheet metal overlapped with the first sheet metal to permit the second sheet metal to electrically connect with the first sheet metal.

8. The conduction structure according to claim 7, wherein the second sheet metal is overlapped with a depression provided in the first sheet metal, the depression being located in the plurality of elastic pieces and directly adjacent to the slit.

9. The conduction structure according to claim 7, wherein support members extending in the direction in which the plurality of elastic pieces is aligned are provided, on a surface on an opposite side of the first sheet metal from a surface with which the second sheet metal is overlapped, at the respective both ends of each of the plurality of elastic pieces provided for the first sheet metal.

10. The conduction structure according to claim 7, wherein each of the protrusions has a spherical surface.

11. An electronic device comprising the conduction structure according to claim 7.

12. The electronic device according to claim 11, wherein the electronic device is to be mounted on a vehicle.

13. The conduction structure according to claim 2, wherein a portion of the second sheet metal is overlapped with the depression of the first sheet metal, the overlapped portion of the second sheet metal being seated within the depression of the first sheet metal so that an upper surface of the second sheet metal does not protrude above a portion of an upper surface of the first sheet metal that is located adjacent to the depression.

14. The conduction structure according to claim 8, wherein a portion of the second sheet metal is overlapped with the depression of the first sheet metal, the overlapped portion of the second sheet metal being seated within the depression of the first sheet metal so that an upper surface of the second sheet metal does not protrude above a portion of an upper surface of the first sheet metal that is located adjacent to the depression.

\* \* \* \* \*